(12) United States Patent
Zhang et al.

(10) Patent No.: US 11,357,116 B2
(45) Date of Patent: Jun. 7, 2022

(54) CORNER PROTECTION DEVICE AND LED DISPLAY SCREEN CABINET

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhiqiang Gao, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 350 days.

(21) Appl. No.: 16/604,649

(22) PCT Filed: Aug. 20, 2019

(86) PCT No.: PCT/CN2019/101596
§ 371 (c)(1),
(2) Date: Oct. 11, 2019

(87) PCT Pub. No.: WO2020/073738
PCT Pub. Date: Apr. 16, 2020

(65) Prior Publication Data
US 2021/0410300 A1    Dec. 30, 2021

(30) Foreign Application Priority Data
Oct. 9, 2018  (CN) .......................... 201811172972.3

(51) Int. Cl.
*H05K 5/00*    (2006.01)
*H05K 5/02*    (2006.01)

(52) U.S. Cl.
CPC ......... *H05K 5/0017* (2013.01); *H05K 5/0217* (2013.01)

(58) Field of Classification Search
CPC .. H05K 5/0217; H05K 5/0017; H05K 5/0021; H05K 2201/10106; H05K 1/18; H04M 1/185; G06F 1/1656; G06F 1/1626
See application file for complete search history.

(56) References Cited

U.S. PATENT DOCUMENTS

| | | | | |
|---|---|---|---|---|
| 8,421,763 B2* | 4/2013 | Liao | ...................... | H04M 1/185 345/173 |
| 8,430,381 B2* | 4/2013 | Chen | ..................... | G06F 1/1601 267/140 |

(Continued)

FOREIGN PATENT DOCUMENTS

CN         205487173 U        8/2016

OTHER PUBLICATIONS

Translation of CN205487173 (Year: 2021).*

*Primary Examiner* — Hung S. Bui
*Assistant Examiner* — Sagar Shrestha (57) ABSTRACT

Provided is a corner protection device, comprising a slide rail shaft, a corner protection and detent mechanism, and a corner protector. The slide rail shaft is fixed on the LED display screen cabinet, the corner protection and detent mechanism is fixed on the sidewall at the top of the cabinet, and the corner protector is slidably disposed on the slide rail shaft. When the corner protector slides to the top of the cabinet, the corner protection and detent mechanism can fix the corner protector on the top of the cabinet so as to protect it. Also provided is an LED display screen cabinet, comprising the corner protection device mentioned above, and a support piece arranged on the sidewall of the cabinet. When the corner protector is fixed on the top of the cabinet, the support piece and corner protector can jointly support the display screen cabinet on the support platform.

8 Claims, 4 Drawing Sheets

(56) References Cited

U.S. PATENT DOCUMENTS

| | | | | |
|---|---|---|---|---|
| 9,612,622 | B2* | 4/2017 | Moon | H02H 7/20 |
| 10,117,345 | B2* | 10/2018 | Yamamoto | H05K 5/0008 |
| 10,505,577 | B2* | 12/2019 | Lin | H04B 1/3833 |
| 2010/0164152 | A1* | 7/2010 | Li | H04M 1/185 |
| | | | | 267/140.15 |
| 2015/0108030 | A1* | 4/2015 | Yin | H04M 1/04 |
| | | | | 206/521 |
| 2015/0331456 | A1* | 11/2015 | Moon | H04M 1/185 |
| | | | | 361/51 |
| 2017/0355507 | A1* | 12/2017 | Rivellini | H01F 7/122 |
| 2019/0165825 | A1* | 5/2019 | Lin | H04B 1/3888 |

* cited by examiner

CORNER PROTECTION DEVICE AND LED DISPLAY SCREEN CABINET

TECHNICAL FIELD

The invention belongs to the technical field of electronic display, in particular to a corner protection device and an LED display screen cabinet.

BACKGROUND

Nowadays, corner protectors for large LED display screen cabinet, are widely used in various activity sites such as stages, gymnasiums and meeting places. The corner protector display screen is usually spliced with several corner protection devices. In the process of transporting and installing the LED display screen cabinet, the four corners of the LED display screen cabinet are easily damaged due to collision, thus affecting the overall display effect of the LED display screen. In order not to damage the four corners of the LED display screen cabinet, currently, the corner protector is mainly fixed on the LED display screen cabinet by rotating and fixing the central axis. However, though the corner protector of this solution covers the two side walls at the top of the LED display screen cabinet for protection, it does not provide a limiting and fixing mechanism. The corner protector can turn back again, thus it does not have a good protection effect.

Moreover, when the LED display screen cabinet is erected while transporting, the LED display screen cabinet will shake and become unstable.

SUMMARY

One of the aims of the present invention is to provide a corner protection device to solve the technical problem in the prior art that the four corners of the LED display screen cabinet are easy to damage.

In order to achieve the above, the present application provides a corner protection device, comprising a slide rail shaft, a corner protection and detent mechanism, and a corner protector. The slide rail shaft is fixed on the LED display screen cabinet, the corner protection and detent mechanism is fixed on the side wall of the top of the LED display screen cabinet, and the corner protector is slidably connected to the slide rail shaft. When the corner protector slides to the top of the LED display screen cabinet and covers both side walls of the top of the LED display screen cabinet and the corner protection and detent mechanism, the corner protection and detent mechanism can fix the corner protector on the top of the LED display screen cabinet.

Further, it also comprises a sliding piece, wherein the slide rail shaft is provided with a slide rail matched with the sliding piece, the sliding piece is slidably disposed in the slide rail, and the corner protector is connected to the sliding piece.

Further, the sliding piece comprises a plurality of sliding shafts, and the plurality of sliding shafts are all slidably disposed in the slide rail and fixedly connected to the corner protector;

The slide rail is a through groove arranged on the slide rail shaft, and the plurality of sliding shafts are all passed through the through groove.

Further, the end of the slide rail near the top of the LED display screen cabinet is closer to the outer periphery of the LED display screen cabinet than the end of the slide rail away from the top of the LED display screen cabinet;

The corner protector is located on one side of the outer periphery of the slide rail shaft, and the distance from the end of the slide rail shaft facing the corner protector near the top of the LED display screen cabinet is closer than the distance from the end away from the top of the LED display screen cabinet, to the outer periphery of the LED display screen cabinet.

Further, the end of the slide rail shaft away from the top of the LED display screen cabinet is provided with an elastic telescopic member, when the corner protector slides to the end of the slide rail shaft away from the top of the LED display screen cabinet, the elastic telescopic member can fix the corner protector to the end of the slide rail shaft away from the top of the LED display screen cabinet.

Further, the corner protection and detent mechanism comprises an elastic detent, the side wall of the top of the LED display screen cabinet is provided with a detent hole, and the elastic detent can draw back in or stretch out of the detent hole, when the corner protector slides to the top of the LED display screen cabinet, the elastic detent presses against the corner protector and limits the corner protector from sliding along the slide rail shaft.

Further, the elastic detent is further provided with an elastic button, and the elastic button can drive the elastic detent to draw back in or stretch out of the detent hole, when the corner protector slides to the top of the LED display screen cabinet, the elastic button is located outside the corner protector.

Further, the corner protector is provided with a detent hole, when the corner protector slides to the top of the LED display screen cabinet, the elastic detent stretches into the detent hole.

Further, the corner protection and detent mechanism comprises a cover plate, the cover plate is provided with a through hole matched with the elastic detent and the elastic button, the elastic detent and the elastic button both stretch out of the through hole, the elastic detent and the elastic button are fixed on the LED display screen cabinet through the cover plate.

The corner protection device provided by the invention has the following beneficial effects: Compared with the prior art, the corner protector of the corner protection device can slide to the top of the LED display screen cabinet along the slide rail shaft, so as to cover and protect the two sides of the top of the LED display screen cabinet; Meanwhile, the corner protection and detent mechanism can lock the corner protector on the top of the LED display screen cabinet, improving the stability of the corner protector while protecting the LED display screen cabinet.

Another object of the present invention is to provide a corner protection device, in order to solve the technical problem in the prior art that the four corners of the LED display screen cabinet are easy to damage.

In order to achieve the above, the present invention provides an LED display screen cabinet, comprising the corner protection device mentioned in any one of the above technical solution, and a support piece arranged on the side wall of the LED display screen cabinet, when the corner protector is fixed on the top of the LED display screen cabinet, the support piece and the corner protector can jointly support the LED display screen cabinet on a support platform.

The LED display screen cabinet provided by the invention has the following beneficial effects: Compared with the prior art, the corner protection device of the LED display screen cabinet can effectively protect the four corners of the LED display screen cabinet and prevent the four corners of the LED display screen cabinet from being damaged; When the LED display screen cabinet is erected, the free end of the support piece can support the LED display screen cabinet together with the corner protector, which plays a protective role, so that the LED display screen cabinet is slightly inclined, thus improving the stability of the erected LED display screen cabinet.

BRIEF DESCRIPTION OF DRAWINGS

In order to more clearly explain the technical solution in the embodiments of the present invention, a brief description of the drawings of the embodiments or the prior art is provided below. It is readily apparent that the following description of the drawings is only for some embodiments of the present invention. For those of ordinary skill in the art, other drawings can be obtained according to these drawings without the exercise of inventive faculty.

10. Slide Rail Shaft; 11. Slide Rail; 12. Shaft Cover Plate; 13. Elastic Telescopic Member; 14. Fixing Hole; 15. Fixed Shaft;

20. Corner Protection and Detent Mechanism; 21. Elastic Detent; 211. Detent Hole; 22. Elastic Button; 221. Button Hole; 23. Cover Plate; 231. Through Hole;

30. Corner Protector; 40. Sliding Piece; 41. Sliding Shaft; 50. Support Piece.

DETAILED DESCRIPTION OF EMBODIMENTS

In order to make the to-be-solved technical problems, technical solutions and beneficial effects of the present invention more clear, the present invention will be described in further detail below with reference to the drawings and embodiments. It should be understood that the specific embodiments described herein are only for the purpose of explaining the present invention and are not intended to limit the present invention.

It should be noted that when an element is referred to as being "fixed" or "disposed" on another element, it may be directly on the other element or indirectly on the other element. When an element is referred to as being "connected" to another element, it may be directly connected to the other element or indirectly connected to the other element.

It should be understood that the terms "length", "width", "upper", "lower", "front", "rear", "left", "right", "vertical", "horizontal", "top", "bottom", "inner", "outer" and the like indicate the orientation or positional relationship based on the orientation or positional relationship shown in the drawings, only for convenience of describing the present invention and simplifying the description, and do not indicate or imply that the said device or element must have a specific orientation, be constructed or operated in a specific orientation, and therefore cannot be understood as a limitation of the present invention.

In addition, in the description of the present invention, the meaning of "plurality" is two or more unless otherwise specifically indicated.

Referring to FIGS. 1 to 5, the corner protection device provided by the present invention will now be described. A corner protection device, comprising a slide rail shaft 10, a corner protection and detent mechanism 20, and a corner protector 30. The slide rail shaft 10 is fixed on the LED display screen cabinet, the corner protection and detent mechanism 20 is fixed on the side wall at the top of the LED display screen cabinet, and the corner protector 30 is slidably connected to the slide rail shaft 10, when the corner protector 30 slides to the top of the LED display screen cabinet and covers both side walls of the top of the LED display screen cabinet and the corner protection and detent mechanism 20, the corner protection and detent mechanism 20 can fix the corner protector 30 on the top of the cabinet.

Compared with the prior art, the corner protection device 30 provided by the invention can slide to the top of the LED display screen cabinet along the slide rail shaft 50, so as to cover and protect the two sides of the top of the LED display screen cabinet; Meanwhile, the corner protection and detent mechanism 20 can lock the corner protector 30 on the top of the LED display screen cabinet, improving the stability of the corner protector 30 while protecting the four corners of LED display screen cabinet.

Figure 5:
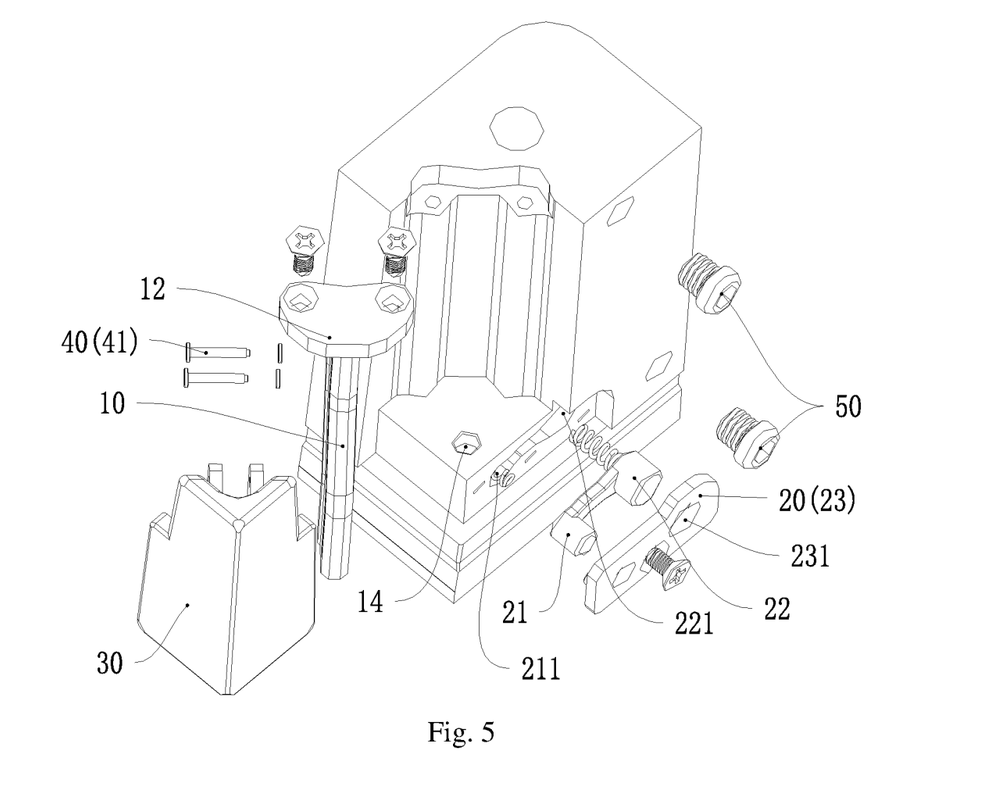
FIG. 5 is an exploded view of FIG. 2.
Figure 7:
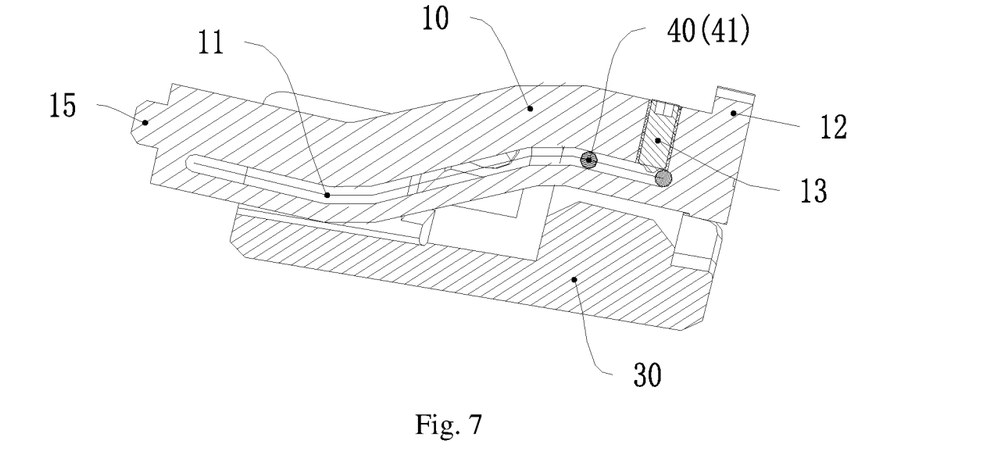
FIG. 7 is a sectional view of the slide rail shaft in FIG. 2. In the FIGURES.

Further, referring to FIGS. 5 and 7, as a specific embodiment of the corner protection device provided by the present invention, it further includes a sliding piece 40, and the slide rail shaft 10 is provided with a slide rail 11 matched with the sliding piece 40. The sliding piece 40 is slidably disposed in the slide rail 11, and the corner protector 30 is connected to the sliding piece 40. The cooperation between the sliding piece 40 and the slide rail 11 makes the sliding of corner protector 30 on the slide rail shaft 10 more smooth, stable and secure.

Further, referring to FIGS. 5 and 7, as a specific embodiment of the corner protection device provided by the present invention, the sliding piece 40 includes a plurality of sliding shafts 41, each sliding shaft 41 is slidably disposed in the slide rail 11 and fixedly connected to the corner protector 30. The matching and fitting between the corner protector 30 and the slide rail shaft 10 are improved, and the sliding of the corner protector 30 on the slide rail shaft 10 is more stable, smooth and secure.

Further, referring to FIGS. 5 and 7, as a specific embodiment of the corner protection device provided by the present invention, the slide rail 11 is a through groove arranged on the slide rail shaft 10, and a plurality of sliding shafts 41 are all passed through the through groove, so that the corner protector 30 can be more firmly, stably and easily slidably connected to the slide rail shaft 10, and the sliding of the corner protector 30 is smoother.

Specifically, referring to FIG. 5, two sliding shafts 41 are provided, which can reduce the friction between the sliding shafts 41 and the slide rail 11, thus improving the stability and smoothness of the sliding of the corner protector 30 on the slide rail shaft 10.

Further, referring to FIG. 5, as a specific embodiment of the corner protection device provided by the present invention, the corner protector 30 is L-shaped, and the inner side of the corner protector 30 is provided with a fixing plate extending along the length direction of the corner protector 30. The slide rail shaft 10 is half surrounded by the fixing plate and the corner protector 30, and the sliding shaft 41 passes through the through groove and its end is fixed on the fixing plate, so that the corner protector 30 can be more firmly and easily slidably disposed on the slide rail shaft 10.

Specifically, the sliding shaft 41 can be a screw or a pin.

Figure 6:
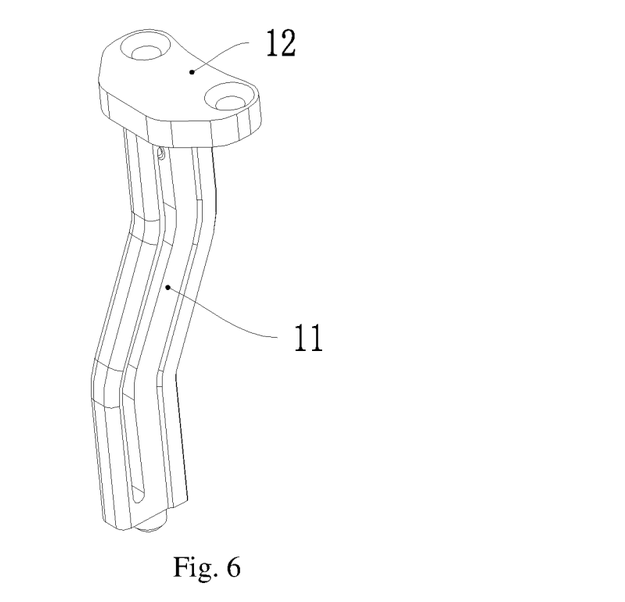
FIG. 6 is a structural schematic diagram of the slide rail shaft in FIG. 5.

Further, referring to FIGS. 6 and 7, as a specific embodiment of the corner protection device provided by the present invention, the end of the slide rail 11 near the top of the LED display screen cabinet is closer to the outer periphery of the LED display screen cabinet than the end of the slide rail 11 away from the top of the LED display screen cabinet. When the corner protector 30 slides to the top of the LED display screen cabinet, the corner protector 30 can protrude outward to cover the two side walls of the top of the LED display screen cabinet, thus protecting the four corners of the LED display screen cabinet. When the corner protector 30 slides to the bottom of the LED display screen cabinet, the corner protector 30 can draw back to the inner sides of the two side walls of the LED display screen cabinet, to avoid disturbing the assembly of the LED display screen cabinet.

Further, referring to FIGS. 6 and 7, as a specific embodiment of the corner protection device provided by the present invention, one end of the slide rail 11 near the top of the LED display screen cabinet is bent toward the direction near the outer periphery of the LED display screen cabinet, so that the corner protector 30 can better protect the LED display screen cabinet, and will not disturb the assembly of the LED display screen cabinet.

Figure 4:
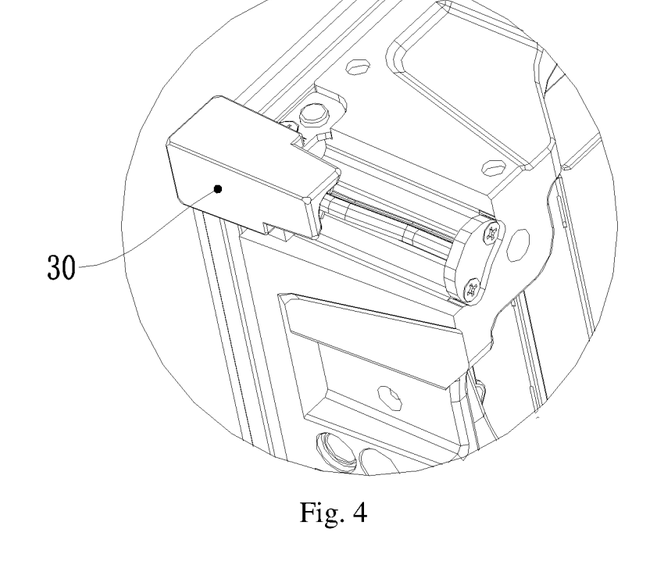
FIG. 4 is a state diagram in which the corner protector in FIG. 2 has slid to the top of the LED display screen cabinet.

Specifically, referring to FIGS. 4 and 6, the slide rail 11 extends from the bottom of LED display screen cabinet toward the top of LED display screen cabinet.

Further, referring to FIGS. 6 and 7, as a specific embodiment of the corner protection device provided by the present invention, the corner protector 30 is located on one side of the outer periphery of the slide rail shaft 10. The end of the slide rail shaft 10 facing the corner protector 30 near the top of the LED display screen cabinet is closer to the outer periphery of the LED display screen cabinet than the end of the slide rail shaft 10 away from the top of the LED display screen cabinet. When the corner protector 30 slides to the top of the LED display screen cabinet, the corner protector 30 can protrude outwards, so that the distance between the corner protector 30 and the side wall of the LED display screen cabinet is closer, so that the LED display screen cabinet can be better protected; When the corner protector 30 slides to the bottom of the LED display screen cabinet, the corner protector 30 can draw back to the inner sides of the two side walls of the LED display screen cabinet, so as to avoid disturbing the assembly of the LED display screen cabinet.

Further, referring to FIGS. 6 and 7, as a specific embodiment of the corner protection device provided by the present invention, the end of the slide rail 11 near the top of the LED display screen cabinet bents toward the direction near the outer periphery of the LED display screen cabinet, so that the corner protector 30 can better protect the LED display screen cabinet, and will not disturb the assembly of the LED display screen cabinet.

Further, referring to FIG. 5, as a specific embodiment of the corner protection device provided by the present invention, the end of the slide rail shaft 10 away from the top of the LED display screen cabinet is provided with a shaft cover plate 12. The slide rail shaft 10 is fixedly connected to LED display screen cabinet through the shaft cover plate 12, which can make the connection of slide rail shaft 10 to LED display screen cabinet more firm and stable, and is convenient to fix the slide rail shaft 10.

Specifically, both the shaft cover plate 12 and the LED display screen cabinet are provided with threaded holes, and slide rail shaft 10 is fixed on the LED display screen cabinet by screws.

Further, referring to FIG. 5, as a specific embodiment of the corner protection device provided by the present invention, the LED display screen cabinet is provided with a fixing hole 14. The end of the slide rail shaft 10 near the top of the LED display screen cabinet is provided with a fixed shaft 15 matched with the fixed shaft 14, and the fixed shaft 15 extends into the fixed shaft 14, so that the slide rail shaft 10 can be more firmly fixed.

Further, referring to FIG. 7, as a specific embodiment of the corner protection device provided by the present invention, the end of the slide rail shaft 10 away from the top of the LED display screen cabinet is provided with an elastic telescopic member 13. When the corner protector 30 slides to the end of the slide rail shaft 10 away from the top of the LED display screen cabinet, the elastic telescopic member 13 can fix the corner protector 30 to the end of the slide rail shaft 10 away from the top of the LED display screen cabinet. When the protection of corner protector 30 is not needed, the corner protector 30 slides to the end of the slide rail shaft 10 away from the top of the LED display screen cabinet, so the elastic telescopic member 13 can fix the corner protector 30 at the bottom of the LED display screen cabinet to prevent the corner protector 30 from sliding towards the top of the LED display screen cabinet and disturbing the assembly of the LED display screen cabinet. When the protection of corner protector 30 is needed, the corner protector 30 slides toward the top of the LED display screen cabinet, so the elastic telescopic member 13 can be pushed back into the slide rail shaft 10, and the corner protector 30 can slide toward the top of the LED display screen cabinet.

Specifically, the elastic telescopic member 13 may be an elastic member having elasticity itself, or an elastic member obtained by fixing a rigid body at the free end of a spring.

Specifically, the elastic telescopic member 13 is an elastomeric bead.

Further, referring to FIG. 5, as a specific embodiment of the corner protection device provided by the present invention, the corner protection and detent mechanism 20 includes an elastic detent 21, the side wall of the top of the LED display screen cabinet is provided with a detent hole 211, and the elastic detent 21 can draw back in or stretch out of the detent hole 211. When the corner protector 30 slides to the top of the LED display screen cabinet, the elastic detent 21 presses against the corner protector 30 and limits the corner protector 30 from sliding along the slide rail shaft 10.

When the corner protector 30 slides toward the top of the LED display screen cabinet, the elastic detent 21 will be pushed into the detent hole 211 by the corner protector 30. When the corner protector 30 is moved to the protective position (the top of the LED display screen cabinet), since the elastic detent 21 has a certain amount of expansion and contraction, the elastic detent 21 will lock the corner protector 30 on the protective position at the top of LED display screen cabinet by friction, thus better protecting the four corners of LED display screen cabinet from damage. When protection for the four corners of the LED display screen cabinet is not needed, users can simply slide the corner protector 30 toward the bottom of the LED display screen cabinet.

Specifically, referring to FIG. 5, the detent hole 211 is a blind hole, a spring is installed in the detent hole 211, and the elastic detent 21 is fixed at the upper end of the spring.

Further, referring to FIG. 5, as a specific embodiment of the corner protection device provided by the present invention, the elastic detent 21 is provided with an elastic button 22, the elastic button 22 can drive the elastic detent 21 to braw back in or stretch out of the detent hole 211, when the corner protector 30 slides to the top of the LED display screen cabinet, the elastic button 22 is located outside the corner protector 30.

When the corner protector 30 slides towards the top of the LED display screen cabinet, press down the elastic button 22 to drive the elastic detent 21 to move so that the elastic detent 21 can draw back into the detent hole 211. When the corner protector 30 slides to the protective position, release the elastic button 22, so that the elastic detent 21 can stretch out of the detent hole 211, press against the corner protector 30, and lock the corner protector 30 on the top of the LED display screen cabinet, so that the corner protector 30 can be more firmly and conveniently fixed on the protective position. When protection for the four corners of the LED display screen cabinet is not needed, press the elastic button 22 again can drive the elastic detent 21 to draw back into the detent hole 211, thus allowing the corner protector 30 to slide to the bottom of the LED display screen cabinet.

Specifically, referring to FIG. 5, the side wall of the LED display screen cabinet is provided with a button hole 221, and the elastic button 22 can draw back into the button hole 221, making the elastic button 22 more convenient to be operated and fixed.

Specifically, referring to FIG. 5, the button hole 221 is a blind hole, a spring is installed in the button hole 221, and the elastic button 22 is fixed at the upper end of the spring.

Specifically, referring to FIG. 5, the elastic detent 21 and elastic button 22 are connected by a connecting plate.

Further, as a specific embodiment of the corner protection device provided by the present invention, the corner protector 30 is provided with a detent hole, and when the corner protector 30 slides to the top of the LED display screen cabinet, the elastic detent 21 stretches into the detent hole, thus he corner protector 30 can be more firmly and conveniently fixed on the protective position of the top of the LED display screen cabinet.

Further, referring to FIG. 5, as a specific embodiment of the corner protection device provided by the present invention, the corner protection and detent mechanism 20 further includes a cover plate 23. The cover plate 23 is provided with a through hole 231 matched with the elastic detent 21 and elastic button 22, and both the elastic detent 21 and elastic button 22 stretch out of through hole 231. The elastic detent 21 and elastic button 22 are fixed to LED display screen cabinet via the cover plate 23.

The elastic detent 21 and elastic button 22 can be more conveniently fixed on the side wall of the LED display screen cabinet, it is more secure, and easier to operate.

Figure 1:
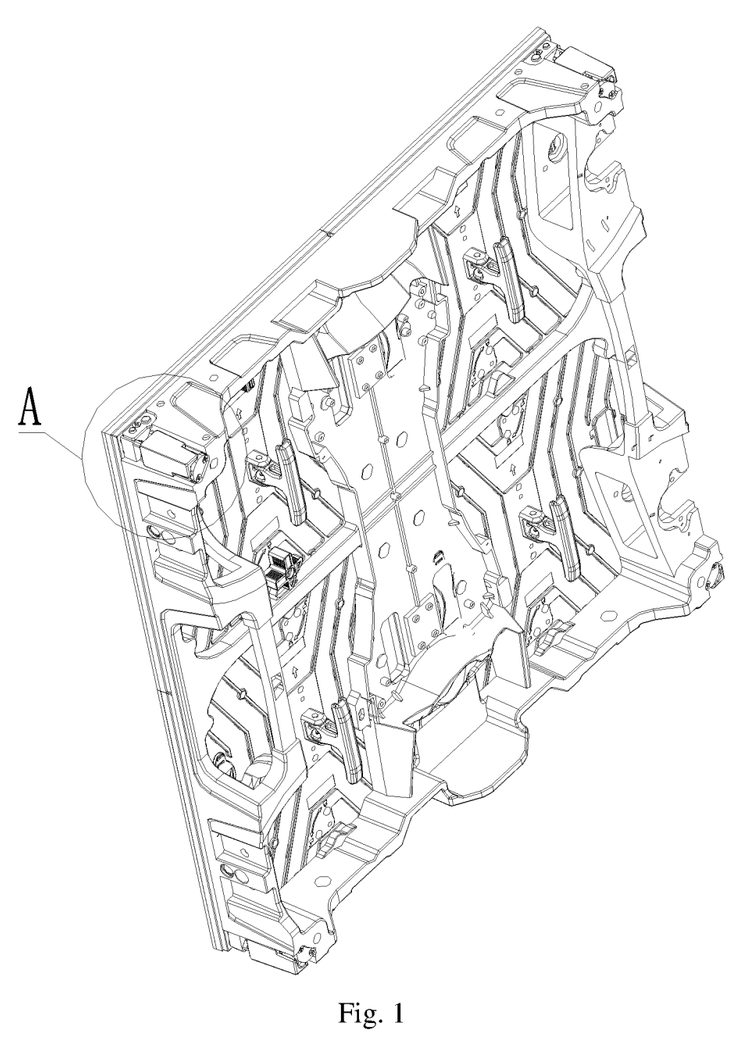
FIG. 1 is a structural schematic diagram of the LED display screen cabinet provided by an embodiment of the present invention.
Figure 2:
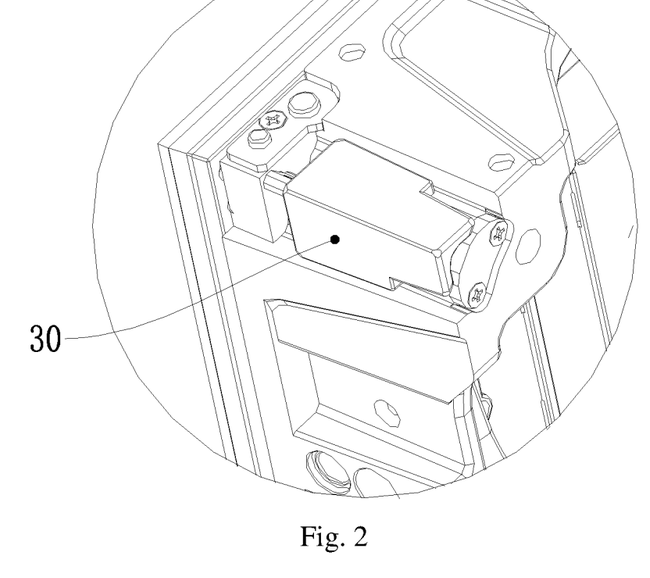
FIG. 2 is an enlarged view of A in FIG. 1.
Figure 3:
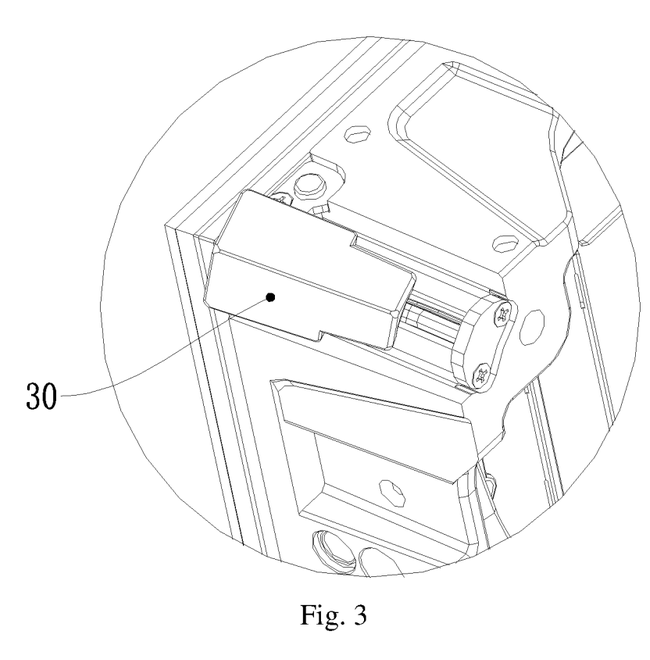
FIG. 3 is a state diagram of the corner protector in FIG. 2 sliding toward the top of the LED display screen cabinet.

Referring to FIG. 1, the LED display screen cabinet provided by the present invention will now be described. The LED display screen cabinet includes the corner protection device mentioned in any of the previous embodiments, and a support piece 50 provided on the side wall of the LED display screen cabinet. When the corner protector 30 is fixed on the top of the LED display screen cabinet, the support piece 50 and the corner protector 30 can jointly support the LED display screen cabinet on the support platform.

Compared with the prior art, the corner protection device provided by the invention can effectively protect the four corners of the LED display screen cabinet and prevent the four corners of the LED display screen cabinet from being damaged; When the LED display screen cabinet is erected, the free end of the support piece 50 can support the LED display screen cabinet together with the corner protector 30, which plays a protective role, so that the LED display screen cabinet can be slightly inclined, thus improving the stability of the erected LED display screen cabinet.

Specifically, there are two support pieces 50.

Specifically, the support pieces 50 are screws.

Further, unless otherwise required by context, singular terms shall include pluralities and plural terms shall include the singular. Thus, as used herein and in the claims, the singular forms include the plural reference and vice versa unless the context clearly indicates otherwise.

The above descriptions are only preferred embodiments of the present invention and are not intended to limit the present invention. Any modification, equivalent substitution and improvement made within the spirit and principles of the present invention shall be included within the scope of protection of the present invention.

What is claimed is:

1. A corner protection device, comprising a corner protector, further characterized by comprising a slide rail shaft, a corner protection and detent mechanism; the slide rail shaft is fixed on a LED display screen cabinet, the corner protection and detent mechanism is fixed on the side wall at the top of the LED display screen cabinet, and the corner protector is slidably connected to the slide rail shaft, when the corner protector slides to the top of the LED display screen cabinet and covers both side walls of the top of the LED display screen cabinet and the corner protection and detent mechanism, the corner protection and detent mechanism can fix the corner protector on the top of the LED display screen cabinet;

the corner protection further comprising a sliding piece, wherein the slide rail shaft is provided with a slide rail matched with the sliding piece, the sliding piece is slidably disposed in the slide rail, and the corner protector is connected to the sliding piece; wherein the sliding piece comprises a plurality of sliding shafts, and the plurality of sliding shafts are all slidably disposed in the slide rail and fixedly connected to the corner protector; the slide rail is a through groove arranged on the slide rail shaft, and the plurality of sliding shafts are all passed through the through groove.

2. The corner protection device of claim 1, wherein the end of the slide rail near the top of the LED display screen cabinet is closer to the outer periphery of the LED display screen cabinet than the end of the slide rail away from the top of the LED display screen cabinet; the corner protector is located on one side of the outer periphery of the slide rail shaft, and the distance from the end of the slide rail shaft facing the corner protector near the top of the LED display screen cabinet is closer than the distance from the end away from the top of the LED display screen cabinet, to the outer periphery of the LED display screen cabinet.

3. The corner protection device of claim 1, wherein the end of the slide rail shaft away from the top of the LED display screen cabinet is provided with an elastic telescopic member, when the corner protector slides to the end of the slide rail shaft away from the top of the LED display screen cabinet, the elastic telescopic member can fix the corner protector to the end of the slide rail shaft away from the top of the LED display screen cabinet.

4. The corner protection device of claim 1, wherein the corner protection and detent mechanism comprises an elastic detent, the side wall of the top of the LED display screen cabinet is provided with a detent hole, and the elastic detent can draw back in or stretch out of the detent hole;

when the corner protector slides to the top of the LED display screen cabinet, the elastic detent presses against the corner protector and limits the corner protector from sliding along the slide rail shaft.

5. The corner protection device of claim 4, wherein the elastic detent is further provided with an elastic button, and the elastic button can drive the elastic detent to draw back in or stretch out of the detent hole;

when the corner protector slides to the top of the LED display screen cabinet, the elastic button is located outside the corner protector.

6. The corner protection device of claim 5, wherein the corner protector is provided with a detent hole, when the corner protector slides to the top of the LED display screen cabinet, the elastic detent stretches into the detent hole.

7. The corner protection device of claim 5, wherein the corner protection and detent mechanism further comprises a cover plate, the cover plate is provided with a through hole matched with the elastic detent and the elastic button, the elastic detent and the elastic button both stretch out of the through hole, the elastic detent and the elastic button are fixed on the LED display screen cabinet through the cover plate.

8. An LED display screen cabinet, characterized by comprising the corner protection device of claim 1, and further comprising a support piece arranged on the side wall of the LED display screen cabinet, when the corner protector is fixed on the top of the LED display screen cabinet, the support piece and the corner protector can jointly support the LED display screen cabinet on a support platform.

\* \* \* \* \*